United States Patent [19]
Fushiki et al.

[11] Patent Number: 5,200,750
[45] Date of Patent: Apr. 6, 1993

[54] DIGITAL-TO-ANALOG CONVERTER WITH NOISE-FREE SIGMA-DELTA MODULATION

[75] Inventors: Tatsuo Fushiki; Sadayuki Narusawa, both of Hamamatsu, Japan

[73] Assignee: Yamaha Corporation, Japan

[21] Appl. No.: 795,757

[22] Filed: Nov. 21, 1991

[30] Foreign Application Priority Data
Nov. 22, 1990 [JP] Japan .................................. 2-319433

[51] Int. Cl.[5] ........................ H03M 3/02; H03M 1/20
[52] U.S. Cl. ....................................... 341/143; 341/77; 341/131
[58] Field of Search .................... 341/76, 77, 131, 143, 341/144

[56] References Cited

U.S. PATENT DOCUMENTS

| | | | |
|---|---|---|---|
| 3,855,555 | 12/1974 | Burkhard et al. | 341/143 |
| 4,025,852 | 5/1977 | Ching | 341/143 |
| 4,142,066 | 2/1979 | Ahamed | 341/143 |
| 4,371,972 | 2/1983 | Schwarz et al. | 341/143 |
| 4,937,576 | 6/1990 | Yoshio et al. | 341/131 |

Primary Examiner—Howard L. Williams
Attorney, Agent, or Firm—Bruce L. Adams; Van C. Wilks

[57] ABSTRACT

The digital-to-analog converter utilizes a modulator for effecting sigma-delta modulation of multi-bit input data to form a pattern of quantized output data so as to produce a pulse signal corresponding to the input data. The converter is provided with a zero detecting circuit for detecting a silent condition when the input data is continuously held at a zero level. An injecting circuit operates when the silent condition is detected for effecting continuous injection of a fractional reset signal into the modulator to gradually change an internal state of the modulator. A control circuit is provided to detect when the modulator reaches an optimum internal state effective to stabilize a varying idling pattern of the quantized output data for stopping the injection of the fractional reset signal so as to effect convergence of the varying idling pattern into a fixed idling pattern which is substantially free of an audible frequency component under the silent condition.

4 Claims, 6 Drawing Sheets

DIGITAL-TO-ANALOG CONVERTER WITH NOISE-FREE SIGMA-DELTA MODULATION

BACKGROUND OF THE INVENTION

The present invention relates to a digital-to-analog converter (hereinafter, referred to as "DAC") utilizing a sigma-delta modulator or $\Sigma\Delta$ modulator, and more specifically relates to a circuit construction thereof for reducing a noise during a silent period in which no signal is inputted into the DAC.

Recently in the field of digital audio technology, there has been utilized a one bit DAC provided with a $\Sigma\Delta$ modulator operative to effect sigma-delta modulation to requantize a multi-bit digital signal into a single bit digital signal. As known in the field, the $\Sigma\Delta$ modulator is a sophisticated modification of a $\Delta$ modulator, substantially including an integrator disposed at an input stage of the $\Delta$ modulator for low frequency boost and a differentiator disposed at an output stage of the $\Delta$ modulator for low frequency cut, thereby performing noise-shaping effective to distribute quantization noise in a higher frequency range to reduce S/N ratio in a lower or audio frequency range.

Figure 7:
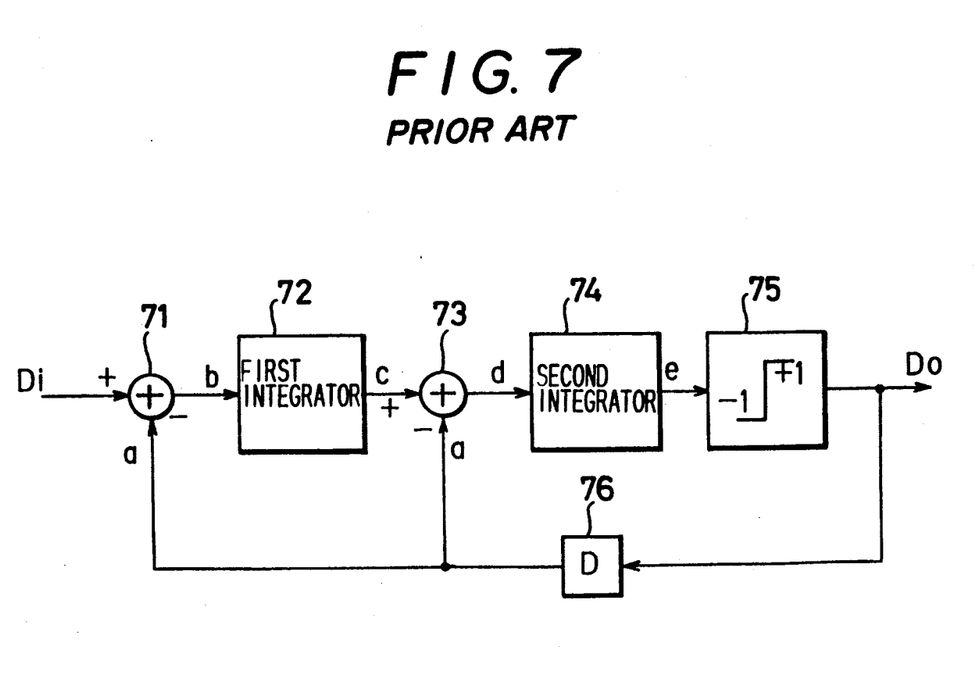
FIG. 7 is a block diagram showing a typical construction of a $\Sigma\Delta$ modulator of the double loop type.

FIG. 7 is a block diagram showing a typical construction of the $\Sigma\Delta$ modulator of dauble loop type. The $\Sigma\Delta$ modulator operates such that a multi-bit input data $D_i$ of, for example, 16-bit length is inputted into an adder 71 which calculates a difference between the input data $D_i$ and a negative feedback data a which is obtained by delaying an output from a one bit quantizing unit 75 through a one sample delay circuit 76. This differential signal b is integrated by a first integrator 72. An output c of the integrator 72 is inputted into another adder 73 which calculates a difference between the output c and the before-mentioned negative feedback signal a. An output d of the adder 73 is integrated by a second integrator 74. An output e of the integrator 74 is inputted into the before-mentioned one bit quantizing unit 75. The quantizing unit 75 is comprised of a zero cross comparator operative when a value of the output e of the second integrator 74 is positive or zero to produce a onebit output data $D_o$ indicative of quantization "+1", and otherwise operative when a value of the output e of the second integrator 74 is negative to produce a onebit output data $D_o$ indicative of quantization "$-1$". As described before, the output data $D_o$ is negatively fed back through the one sample delay circuit 76, in the form of the feedback data a, to the respective adders 71 and 73.

In the thus constructed $\Sigma\Delta$ modulator, if a multi-bit data $D_i$ indicative of value "0.6" is inputted every sample timing, the above mentioned various data or signals a, b, c, d and e take variable values as indicted in the following table 1.

TABLE 1

| $D_i$ | a | b | c | d | e | $D_o$ |
|---|---|---|---|---|---|---|
| 0.6 | * | * | 0 | * | 0 | +1 |
| 0.6 | +1 | −0.4 | −0.4 | −1.4 | −1.4 | −1 |
| 0.6 | −1 | 1.6 | 1.2 | 2.2 | 0.8 | +1 |
| 0.6 | +1 | −0.4 | 0.8 | −0.2 | 0.6 | +1 |
| 0.6 | +1 | −0.4 | 0.4 | −0.6 | 0 | +1 |
| 0.6 | +1 | −0.4 | 0 | −1.0 | −1.0 | −1 |
| 0.6 | −1 | 1.6 | 1.6 | 0.6 | 0.4 | +1 |
| 0.6 | +1 | −0.4 | 1.2 | 0.2 | 0.6 | +1 |
| 0.6 | +1 | −0.4 | 0.8 | −0.2 | 0.4 | +1 |
| 0.6 | +1 | −0.4 | 0.4 | −0.6 | −0.2 | −1 |
| 0.6 | −1 | 1.6 | 2.0 | 3.0 | 2.8 | +1 |

TABLE 1-continued

| $D_i$ | a | b | c | d | e | $D_o$ |
|---|---|---|---|---|---|---|
| 0.6 | +1 | −0.4 | 1.6 | 0.6 | 3.4 | +1 |
| 0.6 | +1 | −0.4 | 1.2 | 0.2 | 3.6 | +1 |
| 0.6 | +1 | −0.4 | 0.8 | −0.2 | 3.4 | +1 |
| 0.6 | +1 | −0.4 | 0.4 | −0.6 | 2.8 | +1 |
| 0.6 | +1 | −0.4 | 0 | −1.0 | 1.8 | +1 |
| 0.6 | +1 | −0.4 | −0.4 | −1.4 | 0.6 | +1 |
| 0.6 | +1 | −0.4 | −0.8 | −1.8 | −1.2 | −1 |
| 0.6 | −1 | 1.6 | 0.8 | 1.8 | 0.6 | +1 |
| 0.6 | +1 | −0.4 | 0.4 | −0.6 | 0 | +1 |

In this table 1, there are obtained twenty number of singlebit output data $D_o$ containing sixteen number of quantizations "+1" and four number of quantizations "$-1$". Therefore, when filtering these sequential output data $D_o$ through an analog low pass filter (not shown in FIG. 7) to produce an analog output signal, this analog output signal may have an averaged level calculated according to the following relation (1):

$$(16-4)/20 = 0.6 \tag{1}$$

In the above one bit DAC utilizing the $\Sigma\Delta$ modulator, since the feedback data a from the delay circuit 76 takes either value of quantization "+1" and "$-1$", the adder 71 will produce an output b having a value of "+1" or "$-1$" when the multi-bit input data $D_o$ becomes zero, for example, during a silent period of a given audio signal. Therefore, if the integrator 72 has stored therein a last internal data having a value other than an integer before the silent period, the integrator 72 produces an output c which may oscillate between positive and negative values around an offset level deviated from the zero level during the silent period. When the output c of the first integrator 72 contains such offset, the second integrator 74 accumulates the offset value so that its output e abruptly shifts periodically everywhen the accumulated value exceeds a critical level. Therefore, the output e of the subsequent integrator 74 is not stabilized to thereby produce noise at a particular frequency of the audio range corresponding to the shifting period.

In view of this drawback, there have been conventionally proposed various counter measures such as the muting method and the resetting method in order to reduce noise during a silent period. The muting method is such that an output of an analog circuit subsequent to the DAC is muted upon detection of a silent period. The resetting method is such that an output of the integrator in the DAC is forcibly reset to the zero level upon detection of a silent period.

However, with regard to the muting method, a muting circuit must be added externally, thereby causing drawbacks such as the overall circuit construction is complicated and a top part of a following audio signal is missing due to a response delay of the analog circuit after releasing the muting operation.

With regard to the resetting method, an output of the integrator abruptly varies at the time of resetting to thereby cause a drawback that the analog output may produce an irregular click sound.

SUMMARY OF THE INVENTION

In view of the above noted drawbacks of the prior art, an object of the present invention is to provide an improved digital-to-analog conversion apparatus constructed to improve S/N ratio during a silent period while avoiding generation of an irregular click sound and missing of a top part of the input signal without complicating circuit construction.

The inventive digital-to-analog conversion apparatus is provided with a typical $\Sigma\Delta$ modulator operative at a given sampling timing for effecting sigma-delta modulation of multi-bit input data to form a pattern of quantized output data so as to produce a pulse-modulated signal corresponding to the input data. Characterizingly, the apparatus is provided with a zero detecting circuit for detecting a silent condition that the input data is continuously held at a zero level, a reset signal injecting circuit responsive to the detection of the silent condition for effecting injection of a fractional reset signal into the $\Sigma\Delta$ modulator to gradually change an internal state of the $\Sigma\Delta$ modulator, and an idling pattern control circuit operative to detect when the $\Sigma\Delta$ modulator reaches an optimum internal state effective to stabilize a varying idling pattern of the quantized output data for stopping the injection of the fractional reset signal so as to effect convergence of the varying idling pattern into a fixed idling pattern which is substantially free of an audible frequency component under the silent condition.

In the typical $\Sigma\Delta$ modulator, the feedback data takes only quantized "+1" or "−1" value. Therefore, when the input data is held at the zero level during a silent period, an integrator of the $\Sigma\Delta$ modulator produces an output having a net variation of "+1" or "−1" every operation timing. Thus, at the time when the input data is turned to the zero level, if the integrator had a last internal value which is ineffective to stabilize the idling pattern, the output of the integrator would remain at an offset level deviated from the zero level, thereby causing an audible noise in an idling pattern.

In view of the above noted nature of the typical $\Sigma\Delta$ modulator, according to the invention, when it is detected that the input data is turned to the zero level, a fractional reset signal having a magnitude below an audible level is continuously injected into the $\Sigma\Delta$ modulator in order to change the internal state of the $\Sigma\Delta$ modulator such as the internal value of the integrator or integrating unit, to an optimum state effective to stabilize or fix the varying idling pattern. Then, when the $\Sigma\Delta$ modulator has reached that optimum state, the injection of the fractional reset signal is stopped so that the varying idling pattern is actually shifted to a given fixed idling pattern which is free of an audible frequency component.

The inventive construction does not necessitate an external addition of a hardware to thereby simplify the circuit structure. Further according to the invention, after the idling pattern is stabilized to a given fixed idling pattern, the $\Sigma\Delta$ modulator is restored in the normal state as in the case of receiving a regular audio input data so that the $\Sigma\Delta$ modulator can instantly respond to a next input data to start the normal processing, thereby avoiding missing of a top part of the incoming input data. Further, according to the invention, as opposed to the prior art in which the idling pattern is forcibly and abruptly switched to the fixed idling pattern, the idling pattern is actually turned to the fixed idling pattern after the $\Sigma\Delta$ modulator has reached a desired optimum internal state, thereby avoiding generation of irregular click sound. Accordingly, the invention is effective to avoid degradation of S/N ratio during a silent period in which an audio input data is held at the zero level.

DETAILED DESCRIPTION OF THE INVENTION

Figure 2:
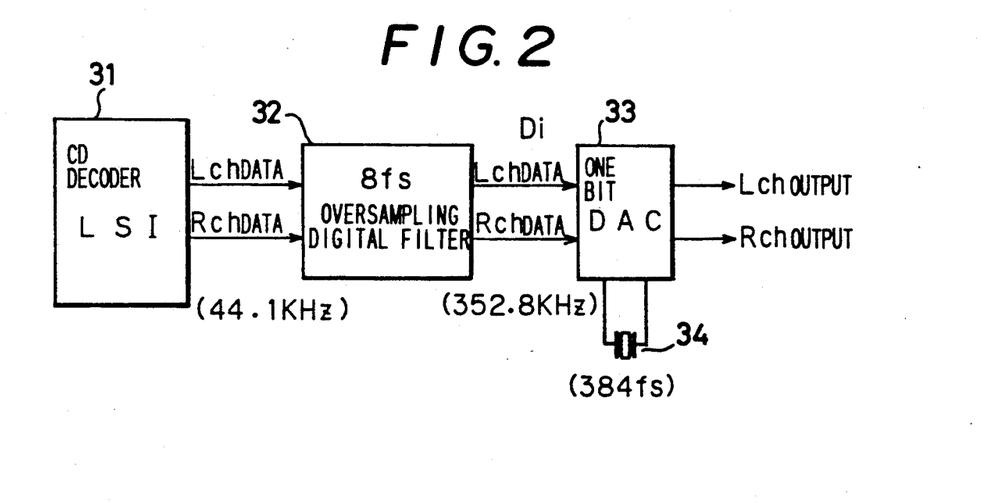
FIG. 2 is a schematic block diagram showing a main signal processing part of a compact disc player utilizing the one bit DAC.

Hereinafter, embodiments of the present invention will be described with reverence to the drawings. FIG. 2 is a block diagram showing a main signal processing part of a compact disc player utilizing the one bit DAC. The compact disc player includes a compact disc decoder 31 of the LSI type operative based on digital data recorded on a compact disc to produce a PCM data of 16-bit length at a sampling frequency fs of 44.1 kHz for left and right channels. A subsequent digital filter 32 oversamples the output data from the decoder 31 at a given oversampling frequency eight times as much as the sampling frequency fs to produce an oversampled output data $D_i$ at $8 \times fs = 352.8$ kHz for the left and right channels. A one bit DAC 33 is provided to effect digital-to-analog conversion of the output data $D_i$ from the oversampling digital filter 32 based on a fast clock signal of $384 \times fs$ fed from an oscillator 34.

Figure 1:
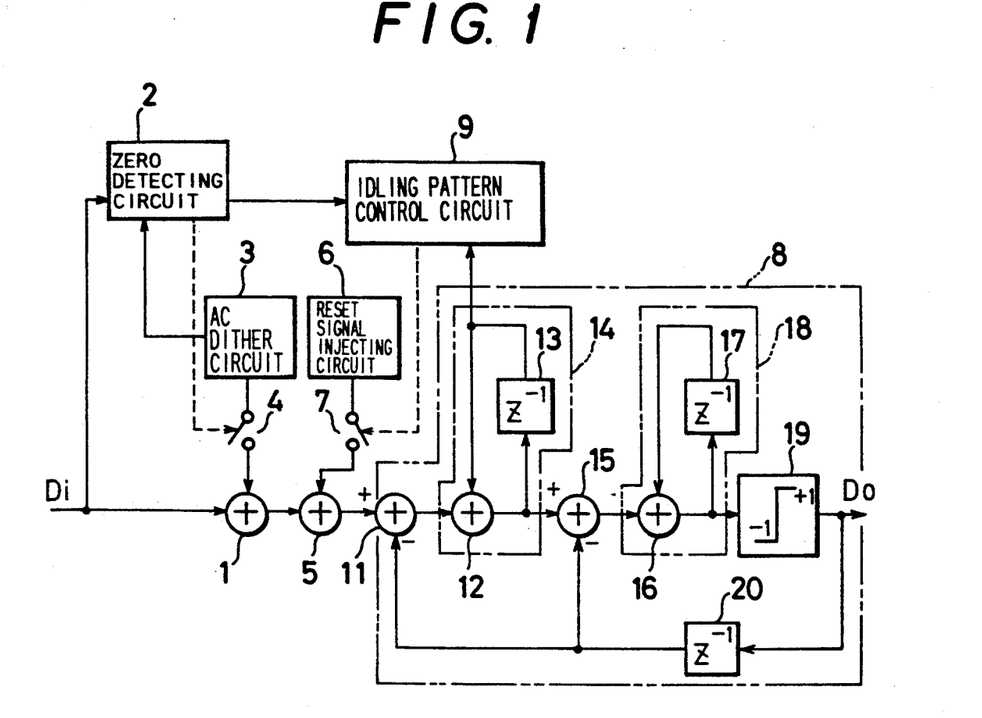
FIG. 1 is a block diagram showing one embodiment of the inventive one bit DAC.

The one bit DAC 33 is constructed as shown in FIG. 1. In the figure, the DAC includes an adder 1 having one input terminal receptive of a sequence of multi-bit input data $D_i$ of, for example, 18-bit length at $8fs = 352.8$ kHz of data transfer frequency. The input data $D_i$ is also fed to a zero detecting circuit 2. The zero detecting circuit 2 operates to detect a silent condition that the input data $D_i$ is continuously shifted to a zero level during a given period. An AC dither circuit 3 is connected through a switch 4 to another input terminal of the adder 1 for supplying thereto an AC dither signal. The switch 4 is selectively turned on and off according to a detection signal from the zero detecting circuit 2. A subsequent adder 5 has one input terminal connected to the output terminal of the preceding adder 1, and another input terminal is connected through a switch 7 to a reset signal injecting circuit 6 to receive therefrom a fractional reset signal. The output of the adder 5 is inputted into a $\Sigma\Delta$ modulator 8 of the double loop type to effect requantization of the multi-bit input data $D_i$ into a pattern of requantized data $D_o$ so as to produce a pulse-density-modulated signal or pulse-width-modulated signal.

The $\Sigma\Delta$ modulator 8 is constructed as follows. There is provided a first subtracting circuit in the form of an adder 11 having a positive or summing input terminal connected to the output terminal of the preceding adder 5, and a negative or subtracting input terminal receptive of a feedback data which is fed back from a one bit quantizing unit 19 through a one sample delay circuit 20, so that the adder 11 carries out subtracting operation to output a differential signal indicative of a difference between the output data from the preceding adder 5 and the feedback data. This differential signal is integrated by a first integrating unit 14 comprised of an adder 12 and a one sample delay circuit 13.

A second subtracting circuit in the form of an adder 15 has a positive or summing input terminal receptive of the output from the first integrating unit 14 and a negative or subtracting input terminal receptive of the feedback data, so that the adder 15 operates to calculate a difference between the two received data. The output of the adder 15 is integrated by a second integrating unit 18 comprised of an adder 16 and a one sample delay circuit 17. The output of the second integrating unit 18 is inputted into the before-mentioned one bit quantizing unit 19. This one bit quantizing unit 19 is composed of a zero cross comparator operative when the output value of the second integrating unit 18 is positive or zero for producing a quantized single bit data indicative of value "+1", and operative when the output value of the second integrating unit 18 is negative for producing another quantized single bit data indicative of value "−1". The output $D_o$ of the quantizing unit 19 is fed forward in the form of a serial pattern of single bit output data $D_o$ which is then converted by an analog low pass filter (not shown) into an analog audio signal corresponding to the input digital data. The same output $D_o$ and is fed back through the one sample delay circuit 20 for use as the feedback data.

An idling pattern control circuit 9 is connected to receive or monitor an internal output of the delay circuit 13 in the first integrating unit 14 of the $\Sigma\Delta$ modulator 8. The idling pattern control circuit 9 detects when the internal output, i.e., an integrated value of the first integrating unit 14 becomes identical to an integer multiple of the quantized feedback data value (hereinafter, referred to as "integer multiple value"), and then the circuit 9 controls to turn off the switch 7 to thereby stop injection of the fractional reset signal into the adder 5.

Next, the description is given for the operation of the thus constructed one bit DAC. During the normal operation, the switch 4 is placed in the closed state and the other switch 7 is placed in the open state so that a sum of the input data $D_i$ and the AC dither signal is fed from the adder 5 to the $\Sigma\Delta$ modulator 8. By this, the $\Sigma\Delta$ modulator 8 carries out the sigma-delta modulation to effect one bit quantization of the multi-bit input data $D_i$. The AC dither signal is added to break correlation between a level of the input data $D_i$ and a quantization noise. Namely, the AC dither signal is utilized to normally suppress an audible noise in the pattern of the quantized output data, which would be otherwise caused when the input data $D_i$ is of a small level.

Then, for example, if the sequence of the input data contains a pause during which a music sound temporarily ceases, the input data $D_i$ is turned to the zero level continuously over a pause period. The zero detecting circuit 2 detects this silent condition and controls to turn off the switch 4 at an optimum timing set to avoid generation of any click sound, so as to stop supply of the AC dither signal. Concurrently, the idling pattern control circuit 9 turns the switch 7 on so that a fractional reset signal is added to the input data $D_i$ of the zero value every sampling timing.

The first adder 11 of the $\Sigma\Delta$ modulator 8 receives at its summing terminal an input of a fractional level which is the sum of the input data $D_i$ of the zero level and the fractional reset signal value. The first adder 11 receives at its subtracting terminal the oscillating feedback data of the binary quantized value. Therefore, the first adder 11 produces an output having the fractional offset level and oscillating around the offset level. On the other hand, at the time when the input data $D_i$ indicative of the silent condition is inputted, the integrating unit 14 has hold therein a last integrated value which is normally not an integer multiple value. However, the input data containing the fractional reset value is continuously fed through the adder 11 to the integrating unit 14 such that the integrating unit 14 accumulates the fractional reset value so that the integrated value thereof will take an integer multiple value at a certain timing.

When the internal output of the first integrating unit 14 reaches a certain integer multiple value, the idling pattern control circuit 9 detects this optimum internal state and controls to turn the switch 7 off to stop supply of the fractional reset signal. Thereafter, the adder 11 is supplied with the pure zero level input data from the adder 5. Since the integrated value in the first integrating unit 14 is once set to an integer multiple value at the time of stop of the fractional reset signal injection, the integrating units 14 and 18 produce internal outputs which oscillate around the zero level. Consequently, the idling pattern of the single bit output data $D_o$ is lastly stabilized to a fixed idling pattern of +1, +1, −1, −1, +1, +1, - - - , which does not contain any audible frequency component.

When a next effective input data is provided after the pause, the zero detecting circuit 2 detects this nonsilent condition to place the switch 4 in the closed state to restore the initial normal state of the one bit DAC to enable the normal operation.

Figure 3:
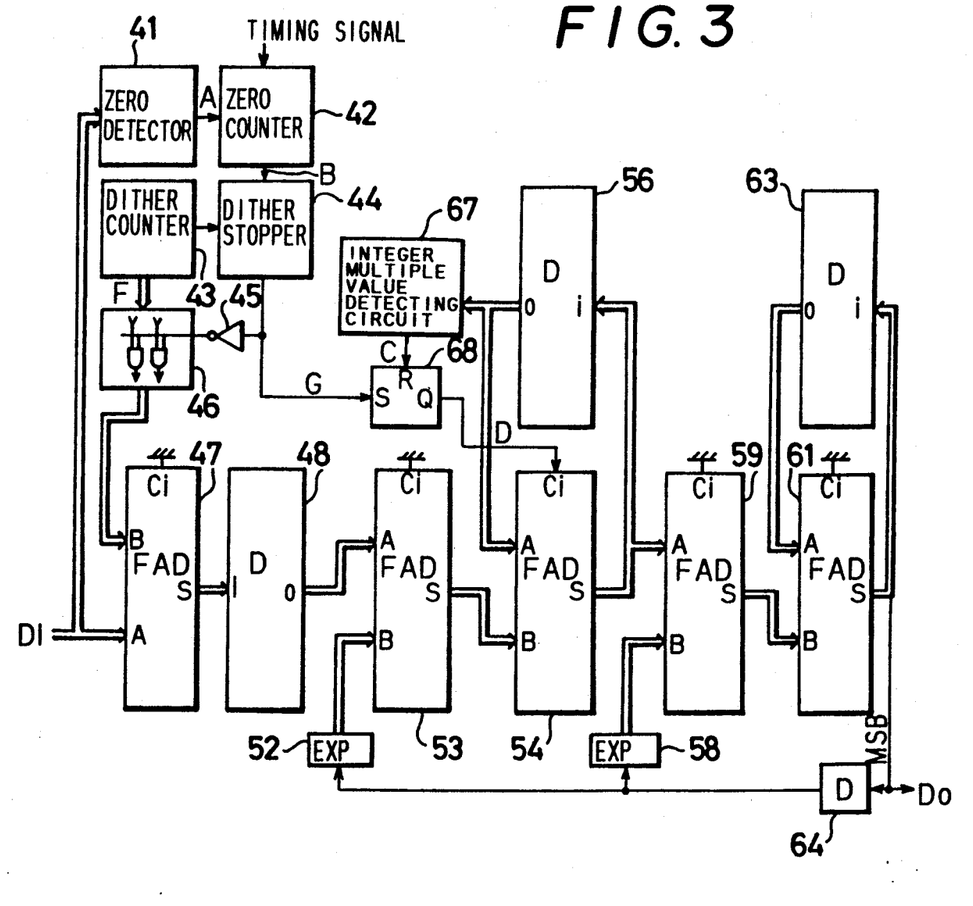
FIG. 3 is a detailed block diagram of the FIG. 1 one bit DAC.

FIG. 3 is a block diagram showing a detailed circuit construction of the FIG. 1 embodiment. In the figure, a zero detector 41 and a zero counter 42 correspond to the zero detecting circuit 2 of the FIG. 1 embodiment. The zero detector 41 produces a signal A having a bit "1" when the input data $D_i$, has the zero value, and another bit "0" when the input data $D_i$ has other values then the zero value. The zero counter 42 carries out count-up operation of the signal A in response to a timing signal when the zero detector 41 outputs continuously the bit "1". Then, when the count reaches $2^{16}$, the zero counter 42 produces a signal B having a flag bit "1", and other occasions the output of the zero counter 42 is held at "0". Further, the zero counter 42 resets its own current count value when receiving a bit "0" from the zero detector 1 to interrupt the count-up operation.

A dither counter 43 corresponds to the AC dither circuit 3 of the FIG. 1 embodiment and operates to produce an AC dither signal F having a given period. A dither stopper 44, an inverter 45 and an AND gate array 46 correspond to the switch 4 of the FIG. 1 embodiment. The dither stopper 44 operates in synchronization with the output period of the dither counter 43 to sample the output signal B of the zero counter 42. Namely, the output signal B is sampled at output timing of the signal F from the dither counter 43. While the output signal B is held at "1", an output signal G from the dither stopper 44 is held at "1". The AND gate array 46 masks suitably the output signal F of the dither counter 43 by an inverted signal from the inverter 45 which inverts the output signal G from the dither stopper 44.

The input data $D_i$ and the dither data through the AND gate array 46 are inputted together into an 18-bit full adder 47. This full adder 47 and a subsequent one sample delay circuit 48 correspond to the adder 1 shown in FIG. 1.

A feedback data of the quantized single bit form is fed back through a delay circuit 64 to a bit expander 52 operative to expand a bit length of the feedback data. A full bit adder 53 algebraically adds the expanded feedback data with the output data of the delay circuit 48 in subtracting manner. These bit expander 52 and full bit adder 53 correspond to the first adder 11 of FIG. 1. Further, a full bit adder 54 and a one sample delay circuit 56 correspond, respectively, to the adder 12 and the delay circuit 13 of the FIG. 1 embodiment, which constitute the first integrating unit 14.

Another bit expander 58 for expanding a bit length of the feedback data and a full bit adder 59 correspond to the second adder 15 of the FIG. 1 embodiment. Further, a full bit adder 61 and a one sample delay circuit 63 correspond, respectively, to the adder 16 and the delay circuit 17 of the FIG. 1 embodiment, which constitute the second integrating unit 18. Most significant bit or MSB of the integrated data in the last adder 61 is retrieved in the form of the binary quantized output data $D_o$ to effect quantization in manner similar to the FIG. 1 one bit quantizing unit 19. In addition, the one sample delay circuit 64 apparently corresponds to the FIG. 1 delay circuit 20.

An integer multiple value detecting circuit 67 corresponds to the FIG. 1 idling pattern control circuit 9. The detecting circuit 67 produces a signal C having a bit "1" when the output data of the delay circuit 56 contained in the first integrating unit takes an integer multiple value, i.e., an integer multiple of the quantized feedback data value, and otherwise the signal C has a bit "0". A flipflop circuit 68 corresponds to a combination of the reset signal injecting circuit 6 and the switch 7 of the FIG. 1 embodiment. The flipflop circuit 68 operates when the output signal G of the dither stopper 44 turns to "1" for setting the flipflop output Q to the level "1", and operates when the output signal C of the integer multiple value detecting circuit 67 turns to "1" for resetting the flipflop output Q to the level "0". The output signal D of this flipflop circuit 68 is applied to a carry input terminal $C_i$ of the full bit adder 54 so as to effect injection of a fractional reset signal in manner similar to the adder 5 of FIG. 1. Namely, the fractional reset signal is provided in the form of a DC carry signal. In detail, since the outputs of the full bit adders 47 and 54 have the same bit length if both the adders have the same bit value in the order of the least significant bit or LSB, the adder 54 is injected with a DC fractional reset signal having a value in the order of LSB of the input data $D_i$. Alternatively, the adder 54 can be provided with expanded plural bits, e, g., two bits, below LSB so that the adder 54 is injected with a DC fractional reset signal having a value in the order of a quarter of LSB of the input multi-bit data $D_i$.

Figure 4:
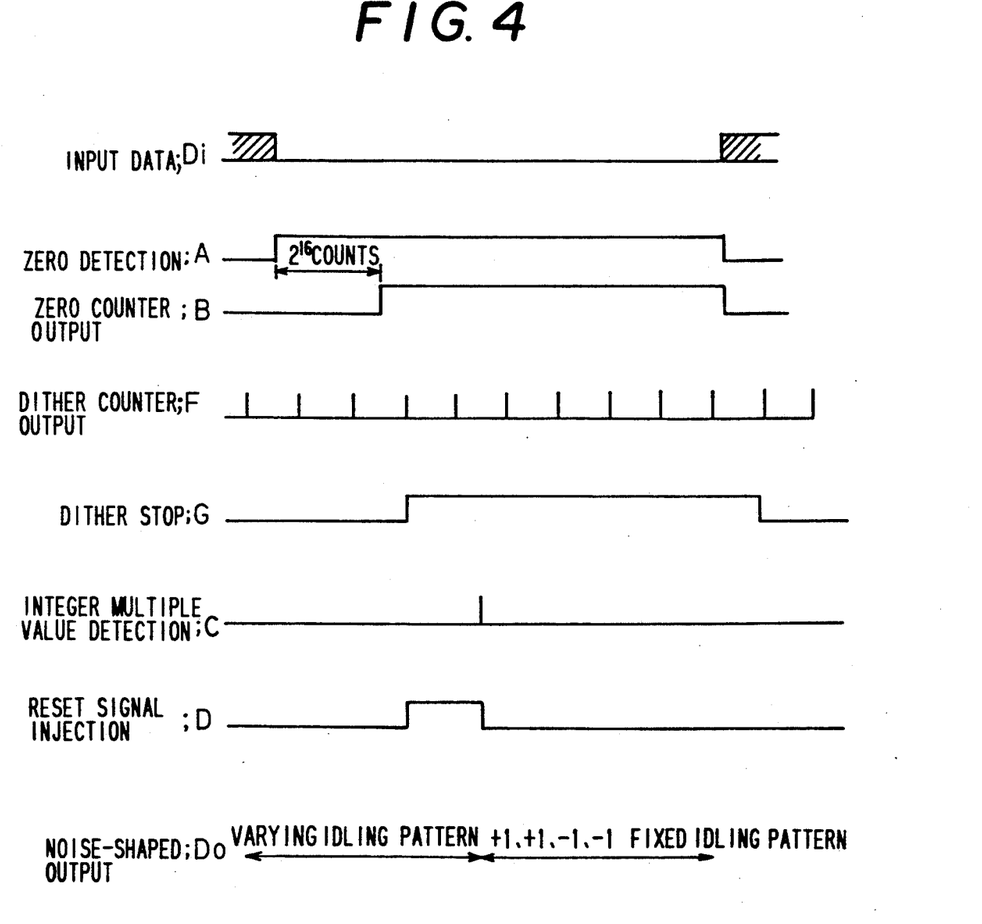
FIG. 4 is a timing chart illustrating the operation of the FIG. 1 one bit DAC.

FIG. 4 is a timing chart illustrative of the operation of the FIG. 3 circuit. When the input data $D_i$ turns to the zero level, the zero detector 41 produces the output signal A raised to "1" level so that the zero counter 42 starts counting-up operation of the sequentially transferred input data $D_i$. When the zero counter 42 counts up a predetermined number, for example, $2^{16}$ counts, the zero counter 42 turns its output signal B to "1" level. When the signal B is raised to the "1" level, the dither stopper 44 turns its own output signal G to the "1" level at the moment when an immediately following pulse occurs in the AC dither signal F fed from the dither counter 43. By this operation, the supply of the dither signal F to the full bit adder 47 is suspended through the AND gate array 46, and concurrently the flipflop circuit 68 is set so as to feed the fractional reset signal D in the form of a sequential carry signal to the full bit adder 54.

Consequently, when the integer multiple value detecting circuit 67 detects that the integrated value reaches a certain integer multiple value in the first integrating unit, the detecting circuit 67 produces the integer multiple value detection signal C effective to reset the flipflop circuit 68 to stop the feeding of the fractional reset signal. Thereafter, the noise-shaped output data $D_o$ is converged into a fixed idling pattern of $+1$, $+1$, $-1$, $-1$, $+1$, $+1$, - - - .

Figures 5A, 5B:
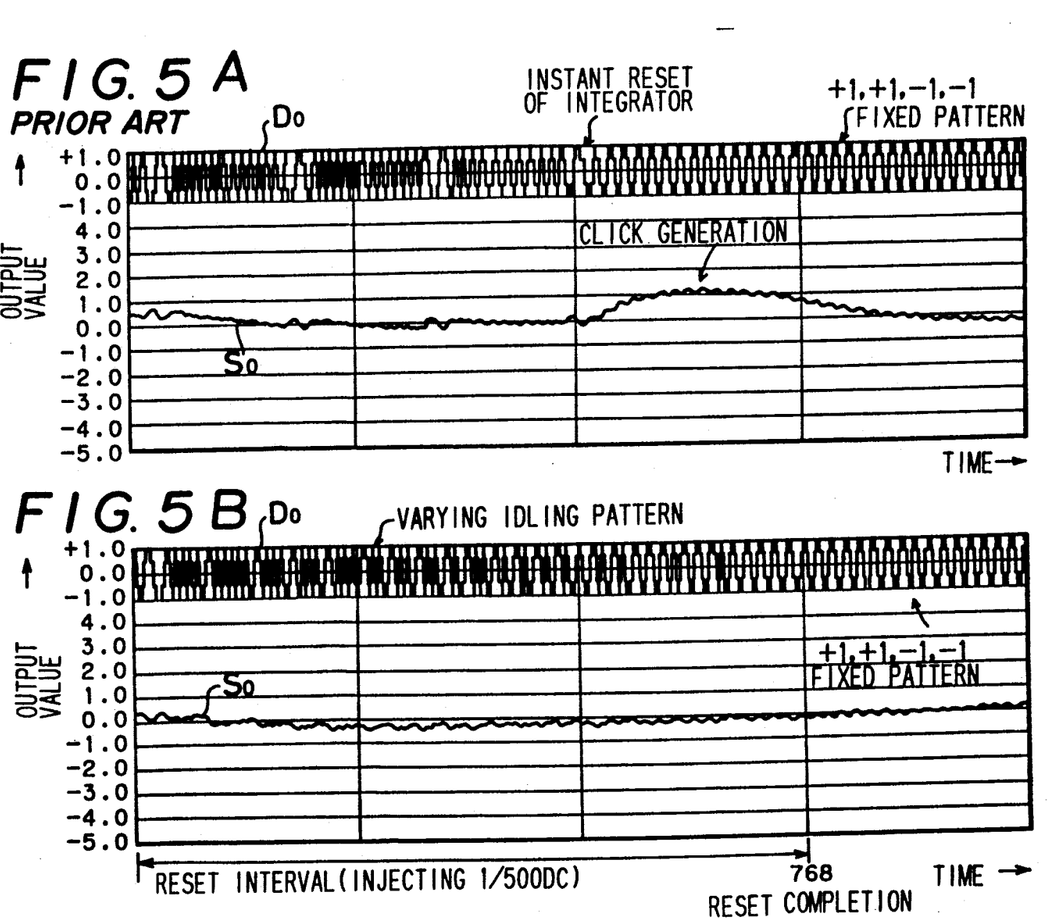
FIG. 5A is a waveform diagram showing an idling pattern and a corresponding analog output of the conventional one bit DAC.
FIG. 5B is a waveform diagram showing an idling pattern and a corresponding analog output of the FIG. 1 one bit DAC.

FIG. 5B is a waveform diagram showing a pattern of the actual single bit data $D_o$ and a simulated analog signal $S_o$ which is obtained by processing the single bit data $D_o$ through an analog low pass filter, observed in the FIG. 3 circuit during a silent period in which the input data $D_i$ is held at the zero level. In this case, the fractional reset signal is continuously injected in the form of a DC fractional signal in the order of 1/500. On the other hand, FIG. 5A shows comparative waveforms of an actual output data $D_o$ and a simulated analog signal $S_o$ observed in the conventional circuit in which the first integrating unit is instantly reset forcibly. As seen from these figures, in the conventional instant reset method, the idling pattern of the output data $D_o$ varies abruptly before and after the instant resetting operation, thereby generating an irregular click sound. On the other hand in the inventive circuit construction, the idling pattern gradually changes until the finish of the continuous injection of the fractional reset signal during a certain period of, for example, 769 sampling times in this case. Thereafter, the idling pattern is stabilized immediately to a fixed pattern of $+1$, $+1$, $-1$, $-1$, - - - , thereby avoiding generation of a click sound.

Figure 6:
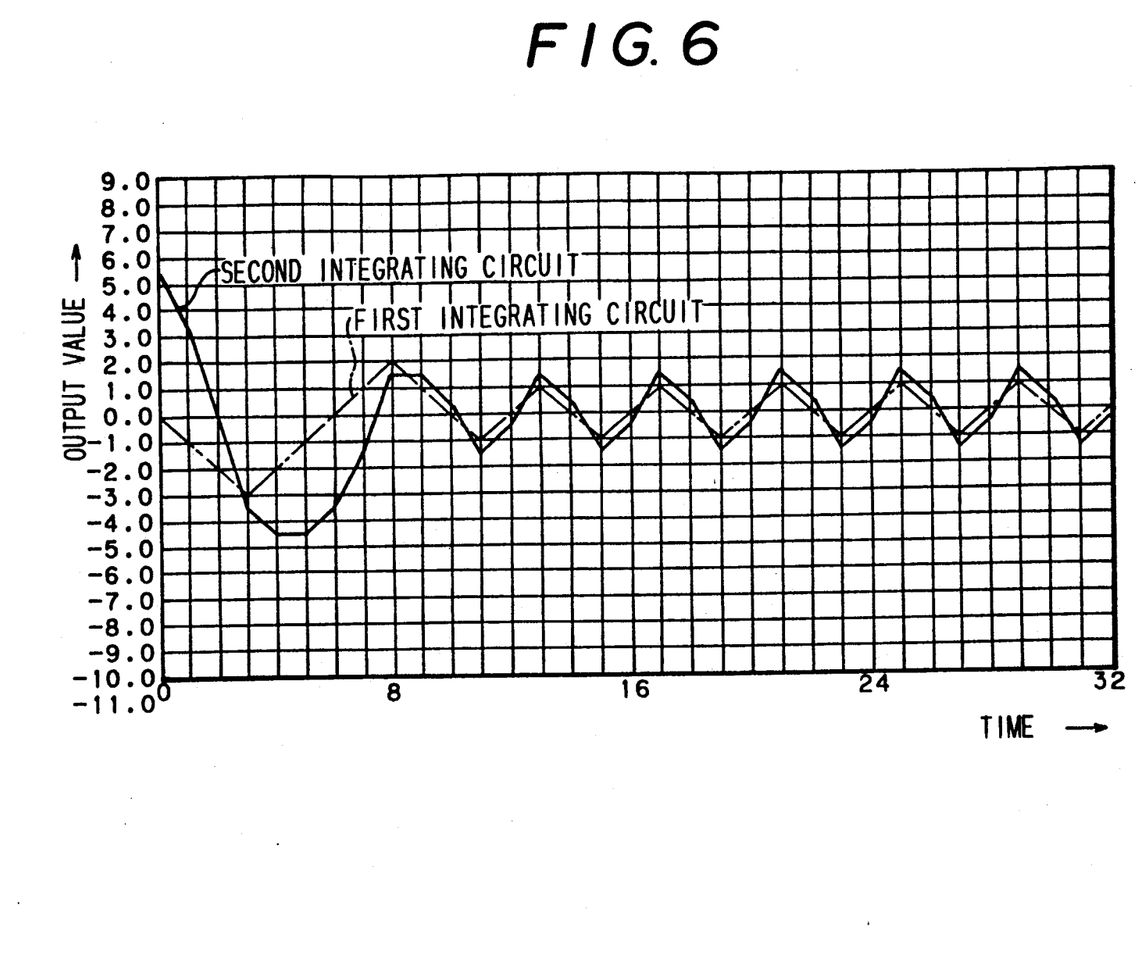
FIG. 6 is a waveform diagram illustrating stabilizing shift of an integrating unit output in the FIG. 1 one bit DAC.

FIG. 6 is a waveform diagram showing outputs of the first and second integrating units 14 and 18 after removing the fractional reset signal just when the output of the first integrating unit 14 reaches an integer value, e.g., "0". As understood from the FIG. 6 diagram, the output of the first integrating unit 14 is oscillated between positive and negative integer values around the zero level because the feedback data from the one bit quantizing unit 19 takes quantized values "$-1$" or "$+1$". Since the output of the first integrating unit 14 takes integer values, the second integrating unit 18 produces the output having a variation in the order of a certain integer multiple value, so that the output of the second integrating unit 18 is soon stabilized to a fixed pattern.

The present invention is not limited to the above described embodiment. For example, though the double loop type $\Sigma\Delta$ modulator is utilized in the above described embodiment, another $\Sigma\Delta$ modulator of the triple loop type or higher multiple loop type can be used instead. Further, the internal state of the $\Sigma\Delta$ modulator can be monitored at an adder connected subsequently to the integrating unit during the course of the injection of a fractional reset signal. Moreover, a fractional reset signal may be injected in the form of an AC signal instead of a DC signal.

As described above in detail, according to the present invention, when the audio input data turns to the zero level during a silent period, a fractional reset signal is continuously injected until the internal state of the ΣΔ modulator is shifted to enable stabilization of a varying idling pattern. Thereafter, the fractional reset signal is stopped so that the idling pattern is actually converged into a fixed idling pattern. By such construction, there can be achieved the advantage that the S/N ratio is effectively improved during a silent period while avoiding missing of a top portion of the input signal and generation of an irregular click sound, without complicating the circuit construction.

What is claimed is:

1. A digital-to-analog conversion apparatus comprising: modulating means for effecting sigma-delta modulation of multi-bit input data to form a pattern of quantized output data so as to produce a pulse signal corresponding to the input data; detecting means for detecting a silent condition when the input data is continuously held at a zero level; injecting means operative when the silent condition is detected for effecting continuous injection of a fractional reset signal into the modulating means to gradually change an internal state of the modulating means; and control means operative to detect when the modulating means reaches an optimum internal state effective to stabilize a varying idling pattern of the quantized output data for stopping the injection of the fractional reset signal so as to effect convergence of the varying idling pattern into a fixed idling pattern which is substantially free of an audible frequency component under the silent condition.

2. A digital-to-analog conversion apparatus according to claim 1; wherein the control means includes means for monitoring an internal multi-bit data circulated in the modulating means to detect the optimum internal state when the monitored internal multi-bit data reaches an integer multiple value of the quantized output data during the course of the continuous injection of the fractional reset signal.

3. A digital-to-analog conversion apparatus according to claim 2; wherein the injecting means includes means for injecting a fractional reset signal in the form of a carry signal effective to carry a lesser significant bit of an internal multi-bit data processed in the modulating means.

4. A digital-to-analog conversion apparatus according to claim 1; including means for feeding to the modulating means a dither signal normally effective to suppress an audible noise in the pattern of the quantized output data, and wherein the control means includes means for suspending the feeding of the dither signal during the course of the injection of the fractional reset signal to achieve the optimum internal state in the modulating means.

* * * * *